(12) United States Patent
Tsubosaki

(10) Patent No.: US 6,808,962 B2
(45) Date of Patent: Oct. 26, 2004

(54) SEMICONDUCTOR DEVICE AND METHOD FOR FABRICATING THE SEMICONDUCTOR DEVICE

(75) Inventor: Kunihiro Tsubosaki, Shinjuku-Ku (JP)

(73) Assignee: Dai Nippon Printing Co., Ltd. (JP)

( * ) Notice: Subject to any disclaimer, the term of this patent is extended or adjusted under 35 U.S.C. 154(b) by 37 days.

(21) Appl. No.: 09/917,854

(22) Filed: Jul. 31, 2001

(65) Prior Publication Data

US 2002/0175409 A1 Nov. 28, 2002

(30) Foreign Application Priority Data

Aug. 2, 2000 (JP) .......................................... 2000-233939

(51) Int. Cl.[7] .............................................. H01L 23/48
(52) U.S. Cl. ........................ 438/118; 257/737; 257/750; 257/758; 257/738; 257/757; 257/751; 257/752; 438/117; 438/119; 438/120; 438/121
(58) Field of Search ................................ 257/737, 738, 257/684, 778, 779, 780, 676, 787, 788, 789, 793, 795, 693, 703, 705; 438/125, 613, 123, 124, 126, 127, 612, 614, 615, 616

(56) References Cited

U.S. PATENT DOCUMENTS

| | | | | |
|---|---|---|---|---|
| 5,897,337 A | * | 4/1999 | Kata et al. ................... | 438/114 |
| 5,946,597 A | * | 8/1999 | Miura et al. ................. | 438/662 |
| 5,949,142 A | * | 9/1999 | Otsuka ........................ | 257/737 |
| 6,153,448 A | * | 11/2000 | Takahashi et al. ........... | 438/114 |
| 6,175,151 B1 | * | 1/2001 | Hashimoto ................... | 257/676 |
| 6,181,569 B1 | * | 1/2001 | Chakravorty ................ | 361/761 |
| 6,198,169 B1 | * | 3/2001 | Kobayashi et al. .......... | 257/780 |
| 6,229,217 B1 | * | 5/2001 | Fukui et al. ................. | 257/777 |
| 6,329,288 B1 | * | 12/2001 | Tokushige et al. ........... | 438/675 |
| 6,350,633 B1 | * | 2/2002 | Lin ............................. | 438/113 |
| 6,350,668 B1 | * | 2/2002 | Chakravorty ................ | 438/612 |
| 6,353,189 B1 | * | 3/2002 | Shimada et al. ............. | 174/225 |
| 6,387,734 B1 | * | 5/2002 | Inaba et al. .................. | 438/125 |
| 6,396,155 B1 | * | 5/2002 | Nukiwa et al. .............. | 257/778 |
| 6,403,460 B1 | * | 6/2002 | Lin ............................. | 438/618 |
| 6,406,942 B2 | * | 6/2002 | Honda .......................... | 438/119 |
| 6,410,858 B1 | * | 6/2002 | Sasaki et al. ................ | 174/255 |
| 6,420,664 B1 | * | 7/2002 | Muramatsu et al. ......... | 174/262 |
| 6,430,059 B1 | * | 8/2002 | Hung et al. .................. | 361/793 |
| 6,472,745 B1 | * | 10/2002 | Iizuka ......................... | 257/723 |
| 6,492,719 B2 | * | 12/2002 | Miyamoto et al. ........... | 257/686 |
| 6,515,370 B2 | * | 2/2003 | Hashimoto ................... | 257/777 |
| 6,559,528 B2 | * | 5/2003 | Watase et al. ............... | 257/684 |
| 6,559,548 B1 | * | 5/2003 | Matsunaga et al. .......... | 257/774 |
| 2002/0064935 A1 | * | 5/2002 | Honda .......................... | 438/622 |
| 2002/0096757 A1 | * | 7/2002 | Takao et al. ................. | 257/690 |

* cited by examiner

Primary Examiner—Nathan J. Flynn
Assistant Examiner—Fazli Erdem
(74) Attorney, Agent, or Firm—Parkhurst & Wendel, L.L.P.

(57) ABSTRACT

The semiconductor device comprises an insulation layer formed on surfaces of semiconductor chips where the electrodes are formed, and a wiring layer formed on the insulation layer. The wiring layer formed on the insulation layer and the electrodes of the semiconductor chips are electrically connected to each other via connection members, such as wire bumps, etc. formed on the electrodes of the semiconductor chip.

9 Claims, 5 Drawing Sheets

SEMICONDUCTOR DEVICE AND METHOD FOR FABRICATING THE SEMICONDUCTOR DEVICE

BACKGROUND OF THE INVENTION

1. Field of the Invention

The present invention relates to a semiconductor device comprising semiconductor chips and a wiring layer, and a method for fabricating the semiconductor device.

2. Description of the Prior Art

Recently, the tendency that electronic equipments have higher performance, and are lighter, thinner, shorter and more down-sized makes semiconductor devices higher integrated, more functional and more down-sized as seen typically in ASIC of LSI.

Conventionally, wafers which have been processed are back-polished, and then diced and cut into respective pellets (also called semiconductor chips or semiconductor elements). Then, die bonding, wire bonding, resin sealing, etc. are performed on the respective pellets, and semiconductor devices are fabricated. The wire bonding electrically connects the semiconductor chips to lead frames.

For high-speed signal processing, semiconductor chips are recently flip chip bonded by using bumps.

The flip chip bonding may be performed by a method of bare chip mounting for mounting semiconductor chips on a print substrate as they are. However, in this method, it is difficult to handle the semiconductor chips. In consideration of retaining reliability, packaged semiconductor chips with bumps are used.

Recently, as a method for fabricating semiconductor devices comprising packaged semiconductor chips with bumps a method in which wiring, external terminals (metal posts), resin seal and bumps are formed on the wafer level, and the wafer is cut into respective semiconductor chips, and the respective semiconductor chips are packaged into CSP (Chip Scale Package) (Chip Scale International 99SEMI 1999) is proposed.

The thus prepared CSP is also called wafer level CSP.

Such semiconductor fabrication is called here wafer level semiconductor fabrication.

A partial section of such semiconductor device is shown in FIG. 9. In FIG. 9, reference number 110 represents semiconductor chips (also called simply chips); reference number 115 represents an electrode (also called a terminal), reference number 120 represents an SiN passivation; reference number 125 represents a polyimide layer; a reference number 130 represents a wiring layer; reference number 131 represents a seed metal layer; reference number 132 represents an electrolytic plated copper layer; reference number 140 represents a resin seal layer (epoxy resin layer); reference number 150 represents a metal post; reference number 160 represents a barrier metal; and reference number 170 represents a solder ball.

In FIG. 9, the terminals 115 of the semiconductor chips 110 are connected to the wiring layer 130 formed on the surfaces of the semiconductor chips 110. The wiring layer 130 is connected to the external terminals (called also the metal posts) 150. The external terminals (metal posts) 150 are connected to the solder bumps 170 via the barrier metal layer 160. A print circuit board is to be soldered by the solder balls 170 as bumps. The form of such semiconductor device, in which the semiconductor chips are mounted on the print circuit board, is similar to the conventional flip chip bonding for mounting semiconductor chips on print substrates.

The seal layer 140 is provided, burying the metal posts 150.

In FIG. 9, the metal posts 150 structurally requires a diameter (100–200 $\mu$m) or about $\frac{2}{3}\times$ a diameter of the solder balls 170, and has an about 100 $\mu$m-height. The metal posts 150 are thick and have high rigidity.

Accordingly, when such semiconductor device mounted on a print circuit board is repeatedly subjected to temperature changes, thermal distortions take place due to thermal expansion coefficients difference ($\Delta\alpha$) between the respective semiconductor chips and the mounted print circuit board takes place, and cracks occur in the semiconductor chips 110 below the metal posts 150.

The resin seal layer 140 is provided only on a surfaces of the semiconductor chips 110 where the wiring layer 130 is formed, which permits warps to occur. Accordingly, problems of poor flatness of the solder balls 170 and low mounting yields occur.

SUMMARY OF THE INVENTION

In view of the above-described problems, the present invention was made, and an object of the present invention is to provide a semiconductor device which does not permit cracks and warps to occur in semiconductor chips mounted on a substrate even when subjected to temperature changes, and which has accordingly high yields, and a method for fabricating the semiconductor device.

The present invention is a semiconductor device comprising a semiconductor chip having electrodes; an insulation layer formed on a surface of the semiconductor chip where the electrodes of the semiconductor chip are formed; and a wiring layer formed on the insulation layer, the electrodes of the semiconductor chip and the wiring layer being connected to each other via connection members disposed in the insulation layer.

The present invention is the semiconductor device wherein the connection members include wire bumps disposed on the electrodes of the semiconductor chip.

The present invention is the semiconductor wherein the connection members further include cured conductive pastes formed on the wire bumps.

The present invention is the semiconductor device wherein the connection members include a metal layer formed on the electrodes of the semiconductor chip, and cured conductive pastes disposed on the metal layer.

The present invention is the semiconductor device comprising a solder resist layer having openings, for covering the wiring layer, solder balls disposed in the openings of the solder resist layer, connected to the wiring layer.

The present invention is the semiconductor device wherein an additional insulation layer is formed on a surface of the semiconductor chip, which is opposite to the surface where the electrodes are formed.

The present invention is a method for fabricating a semiconductor device comprising the steps of preparing a wafer including a plurality of semiconductor chips with electrodes formed on; forming connection members on the electrodes of the respective semiconductor chips; forming an insulation layer in a thickness to cover the connection members on the surfaces of the respective semiconductor chips where the electrodes of the semiconductor chips are formed; polishing the insulation layer to expose the connection members;
forming an electroless plated layer on the insulation layer; and forming, with the electroless plated layer as a feeder layer of electric current, an electrolytic plated layer on the electroless plated layer selectively only in regions for a wiring layer; etching off the electroless plated layer except regions of the electroless plated layer corresponding to the electrolytic plated layer to form the wiring layer including the electroless plated layer and the electrolytic plated layer; and severing the wafer into the respective semiconductor chips to fabricate the semiconductor device.

The present invention is the method for fabricating a semiconductor device further comprising the steps of forming a solder resist layer having openings on the wiring layer; and forming solder balls in the openings of the solder resist layer, connected to the wiring layer.

The present invention is the method for fabricating a semiconductor device wherein the connection members are formed by forming wire bumps on the electrodes of the semiconductor chips by wire bonding.

The present invention is the method for fabricating a semiconductor device wherein the connection members are formed by forming cured conductive pastes on the wire bumps.

The present invention is the method for fabricating a semiconductor device wherein the connection members are formed on the electrodes of the semiconductor chips by forming a metal layer by sputtering and forming cured conductive pastes on the metal layer.

The present invention is the method for fabricating a semiconductor device wherein in the step of forming an electrolytic plated layer, a resist pattern of a prescribed configuration is formed on the electroless plated layer, and the electrolytic plated layer is selectively formed with the resist pattern as a plating-resistant mask.

The present invention is the method for fabricating a semiconductor device wherein in the step of forming an wiring layer by etching, the resist pattern of a prescribed configuration on the electroless plated layer removed, and then the exposed electroless plated layer is removed by soft etching without damaging the wiring layer.

The present invention is the method for fabricating a semiconductor device wherein the step of polishing the insulation layer is followed by surface roughening processing for roughening the surface of the insulation layer.

The present invention is the method for fabricating a semiconductor device wherein in the step of forming a solder resist layer, a photosensitive solder resist is formed by screen printing, to cover the wiring layer, and prescribed regions of the photosensitive solder resist are exposed and developed to form the openings so as to expose the wiring layer.

The semiconductor device according to the present invention, owing to the above-described constitutions, does not have easily cracks in the semiconductor chips even when temperatures change.

Especially in the case where the connection members are wire bumps, the wiring formed on the insulation layer and the electrodes of the semiconductor chips are electrically connected to each other via the wire bumps formed on the electrodes of the chips. The wire bumps are formed of Au wires or others, which are soft and ductile, and accordingly can be formed thin and high. Even when the semiconductor device is repeatedly subjected to thermal stresses, the wire bumps themselves are deformed to mitigate the stresses to hinder the occurrence of cracks in the semiconductor chips.

In the conventional semiconductor device, whose metal posts are hard and thick, cannot deform themselves and accordingly has relatively low strength. Cracks occur in the surface of the semiconductor chips, the connection portions of the solder balls, etc.

According to the present invention, in the case where the connection members are formed of the wire bumps formed on the electrodes of the semiconductor chips and the cured conductive pastes formed on the wire bumps, the insulation layer forming step can be easy. Besides, the reliability of the connection at the time when the semiconductor device is repeatedly subjected to thermal stresses can be higher.

That is, the cured conductive pastes can be formed on the wire bumps to be high and have a point to tops of the pastes. Accordingly, the connection members can be passed, without being deformed, through the insulation layer, which is to be formed in the later step by laminating an epoxy-based material as the insulation layer.

In the case where the connecting members are formed of the metal layer formed on the electrodes of the semiconductor chips and the cured conductive pastes formed on the metal layer, the step of forming the connecting members can be processed in the unit of a wafer, and processing amount can be small.

The cured conductive pastes can have a thermal expansion coefficient which is relatively equal to that of the insulation layer, and has flexibility. Even when the cured conductive pastes are repeatedly subjected to thermal stresses, no cracks occur in the cured conductive pastes. The reliability can be accordingly high.

Because of the insulation layer formed on the surface of the semiconductor chips, which is opposite to the side of the semiconductor chips, where the electrodes are formed, warps do not easily occur, and high mounting yields can be provided.

Because of the solder resist layer covering the wiring, and the external terminals in the form of the solder balls, which are provided in the external terminal forming regions, the semiconductor device can be easily fabricated.

According to the method for fabricating the semiconductor device according to the present invention, the semiconductor device is fabricated to have the above-described constitutions, whereby even when the semiconductor device mounted on a substrate is repeatedly subjected to temperature changes, cracks do not easily occur in the semiconductor chips, and the connection portions cannot be easily broken. Furthermore, warps do not easily occur, and accordingly high mounting yields can be provided.

DESCRIPTION OF THE PREFERRED EMBODIMENTS

Embodiments of the present invention will be explained with reference to FIGS. 1 to 8.

Figure 1:
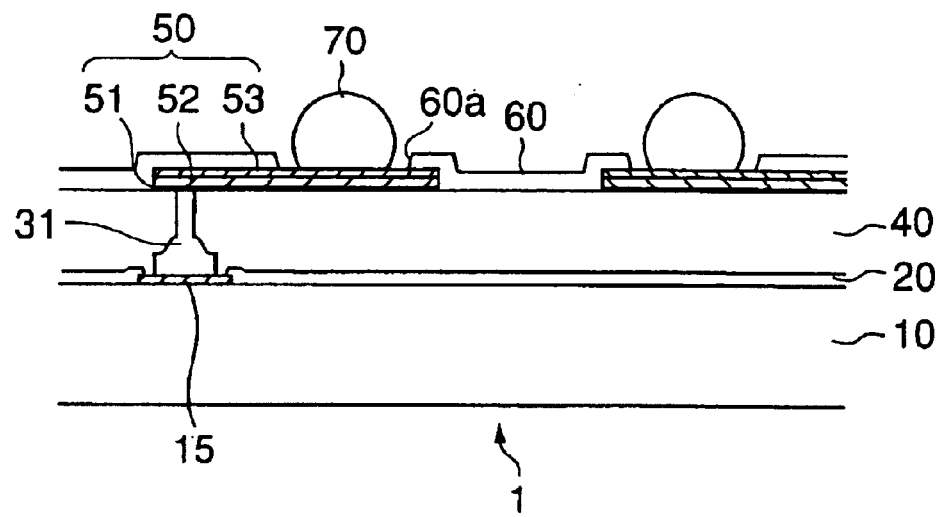
FIG. 1 is a partial sectional view of the semiconductor device according to a first embodiment of the present invention.
Figure 2:
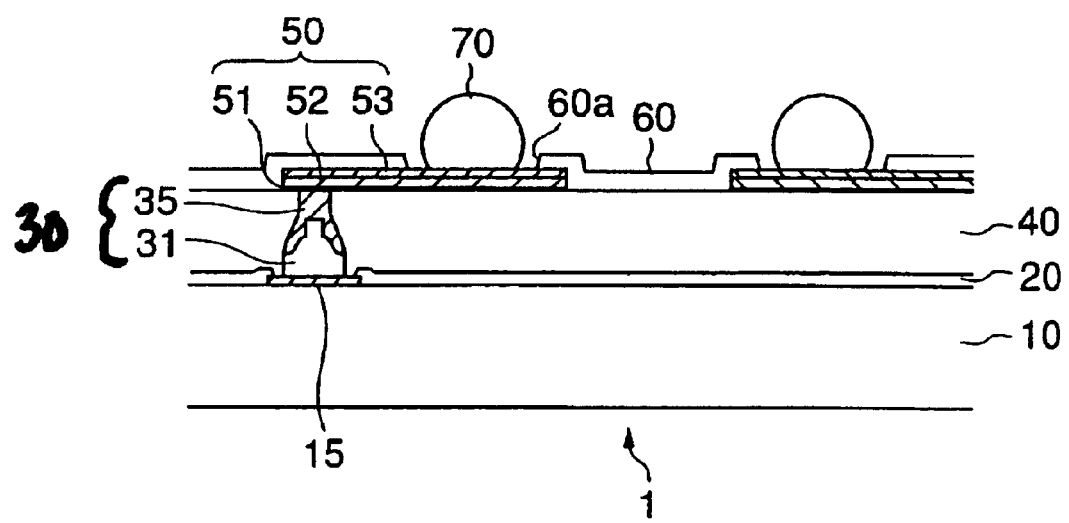
FIG. 2 is a partial sectional view of the semiconductor device according to a second embodiment of the present invention.
Figure 3:
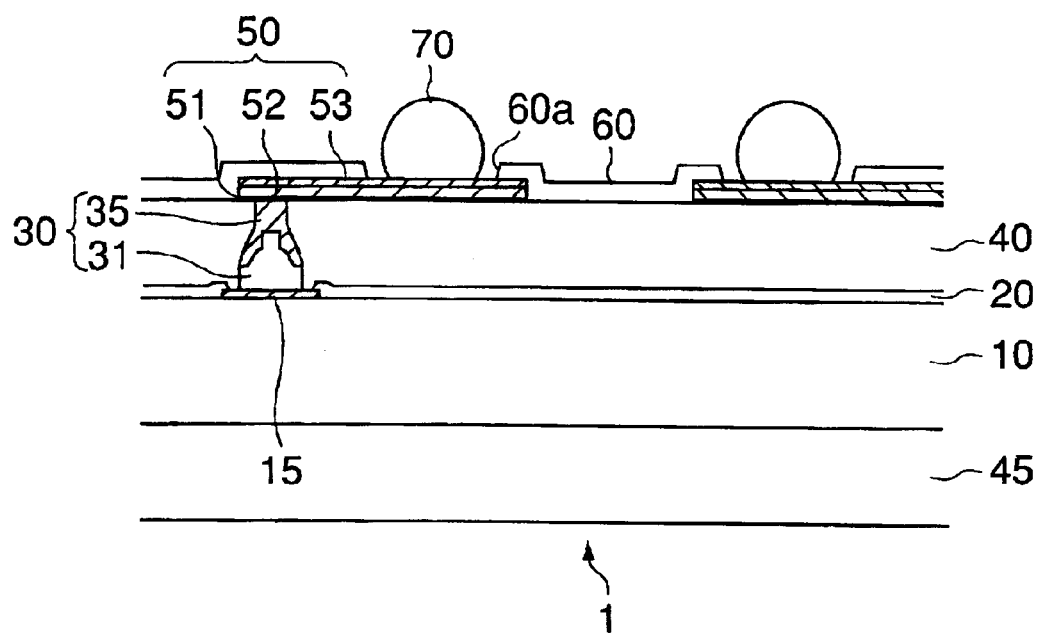
FIG. 3 is a partial sectional view of the semiconductor device according to a third embodiment of the present invention.
Figure 4:
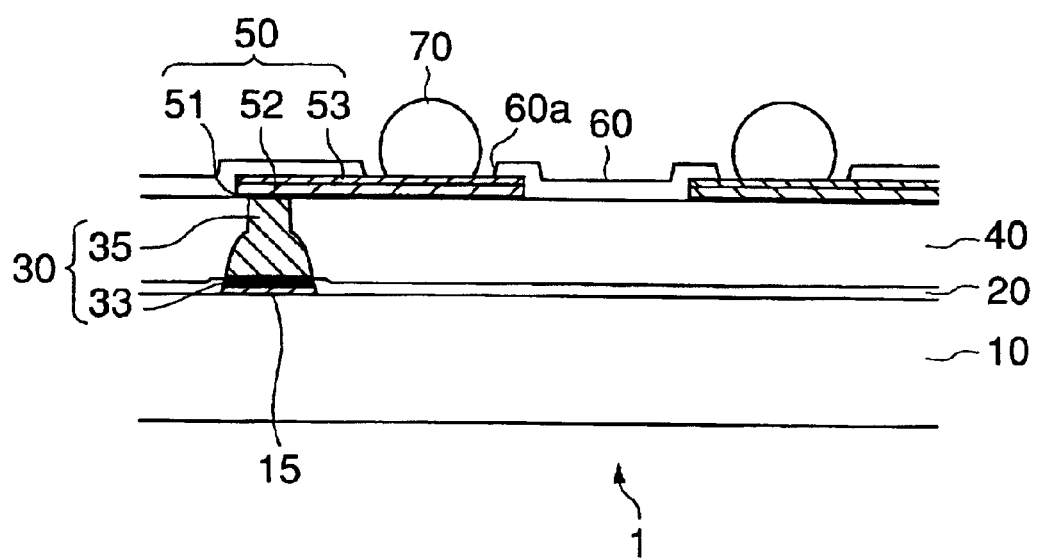
FIG. 4 is a partial sectional view of the semiconductor device according to a fourth embodiment of the present invention.
Figure 5:
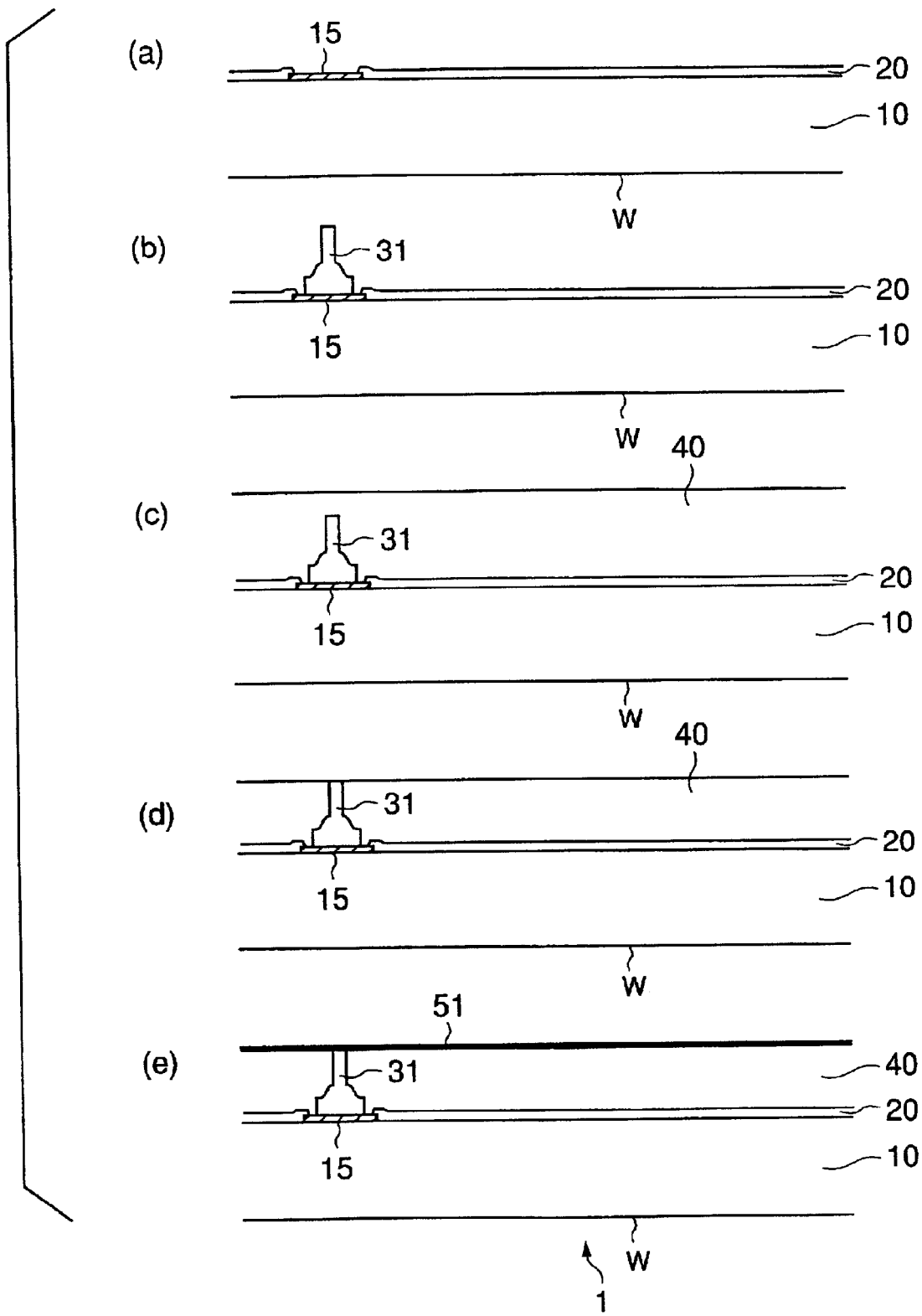
FIG. 5 is sectional views of the semiconductor device shown in FIG. 1 in the steps of the method for fabricating the semiconductor device, which show the method.
Figure 6:
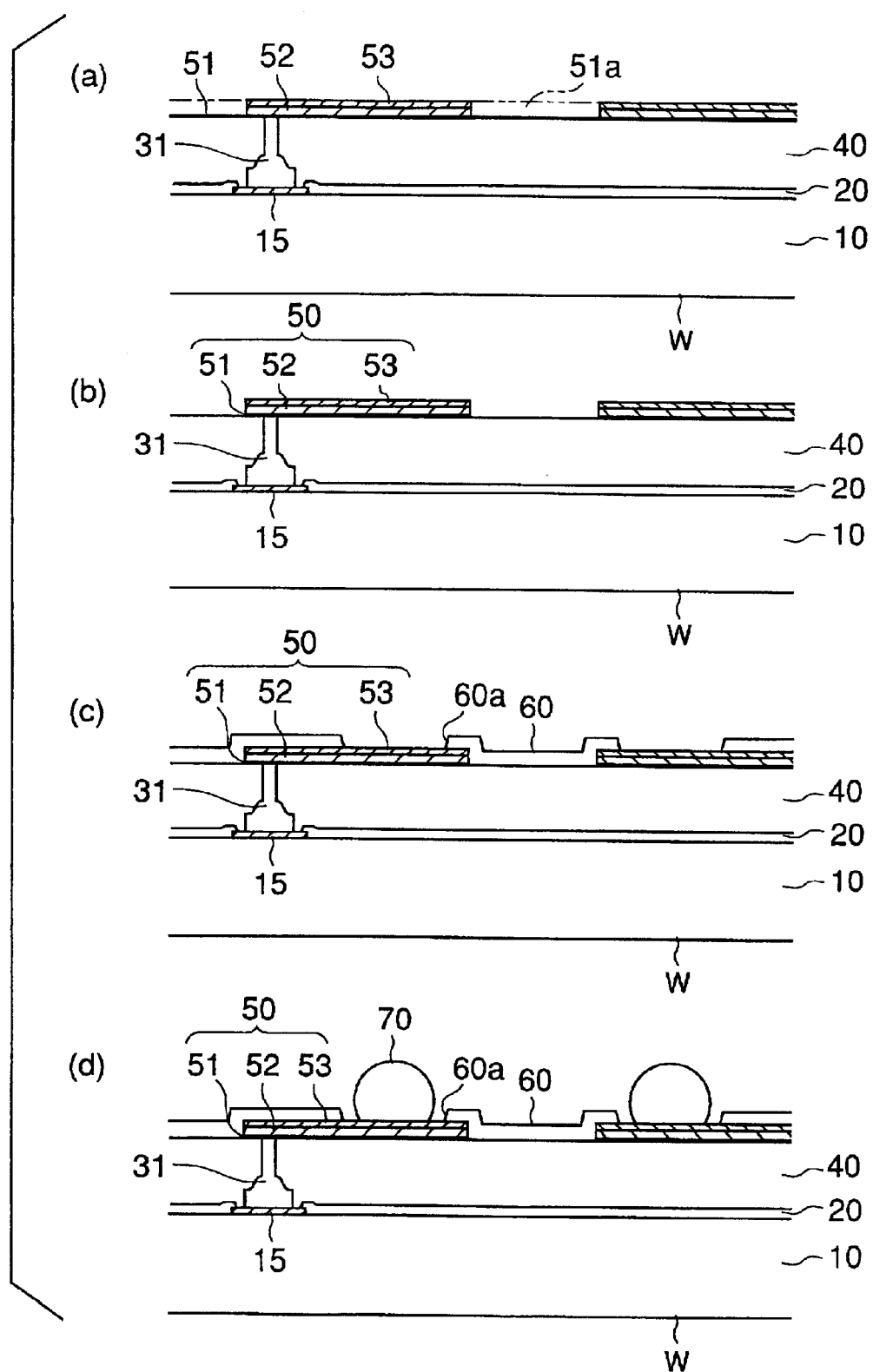
FIG. 6 sectional views of the semiconductor device shown in FIG. 1 in the steps of the method for fabricating the semiconductor device, which show the method.
Figure 7:
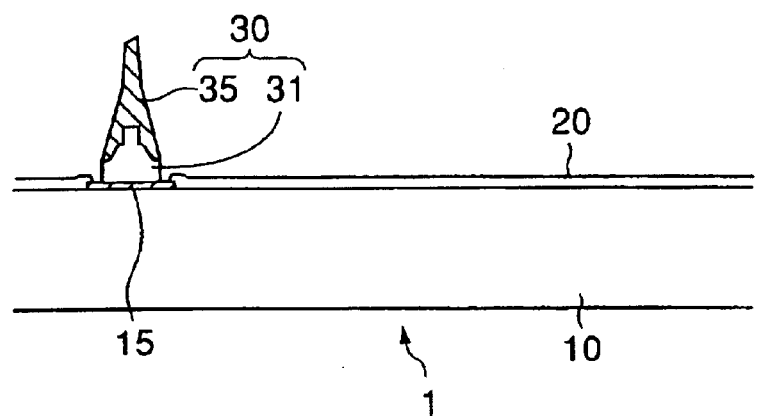
FIG. 7 is views of a conductive paste and a wire bump in fabricating the semiconductor device shown in FIG. 2.
Figure 8:
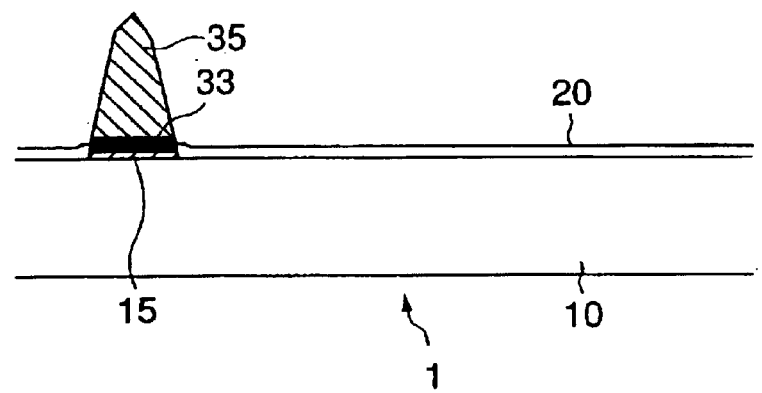
FIG. 8 is a view of a cured conductive paste in fabricating the semiconductor device shown in FIG. 4.
Figure 9:
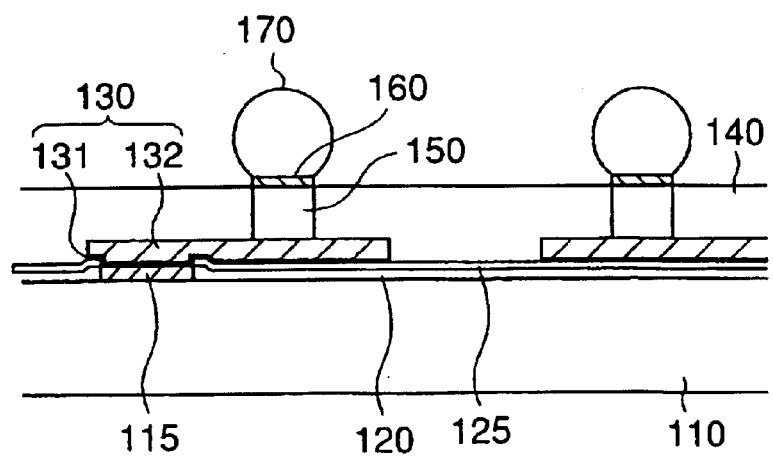
FIG. 9 is a view of the conventional semiconductor device.

FIG. 1 is a partial sectional view of the semiconductor device according to a first embodiment of the present invention. FIG. 2 is a partial sectional view of the semiconductor device according to a second embodiment of the present invention. FIG. 3 is a partial sectional view of the semiconductor device according to a third embodiment of the present invention. FIG. 4 is a partial sectional view of the semiconductor device according to a fourth embodiment of the present invention. FIGS. 5 and 6 are partial sectional view of the semiconductor device shown in FIG. 1 in the steps of the method for fabricating the semiconductor device, which show the method. FIG. 7 is view explaining the formation of a conductive paste on a wire bump in fabricating the semiconductor device shown in FIG. 2. FIG. 8 is a view explaining the formation of a cured conductive paste in fabricating the semiconductor device shown in FIG. 4.

The semiconductor device according to the first embodiment of the present invention will be explained with reference to FIG. 1.

As shown in FIG. 1, a semiconductor device 1 comprises a semiconductor chip 10 with electrodes 15 on a surface of the semiconductor chip; a passivation layer 20 and an insulation layer 40 formed on the surfaces of the semiconductor chips 10, where the electrodes 15 are formed, and a wiring layer 50 formed on the insulation layer 40.

In FIG. 1, the wiring layer 50 formed on the insulation layer 40, and the electrodes 15 of the semiconductor chips 10 are electrically connected to each other via wire bumps (connection members) 31 formed on the electrodes 15 of the semiconductor chips 10.

A solder resist film 60 is formed on the insulation layer 40 and the wiring layer 50, covering the insulation layer 40 and the wiring layer 50. Openings 60a are formed in the solder resist layer 60, as regions for external terminals of the wiring where solder balls are formed. In the openings 60a, the external terminals 70 in the form of the solder balls are formed, connected to the wiring layer 50.

The semiconductor chips 10, the electrodes 15 and the passivation layer 20 (see FIG. 5(a)) are formed by an ordinary semiconductor process. The electrodes 15 are generally Al electrodes, and the passivation layer 20 is ordinarily an SiN film or an SiN film and a polyimide layer.

The wire bumps 31 are formed through the insulation layer 40 and formed on the electrodes 15 by wire-bonding gold wires or others. The wire bumps 31 are formed by polishing the wires projected substantially perpendicularly to the surfaces of the semiconductor chips 10 together with the insulation film 40 to expose flat surfaces of the wires on the insulation layer 40 flush with the surface of the insulation layer 40.

The wiring layer 50 has an electroless plated layer (seed metal) 51, and electrolytic plated layers 52, 53 formed on the electroless plated layer 51.

The electrolytic plated layer 52 is the main layer of the wiring layer and is generally formed of a copper layer in terms of conductivity and costs. However, the electrolytic plated layer 52 is not essentially limited with a copper layer.

The electrolytic plated layer 53 is a barrier metal layer and is provided for the prevention of forming an alloy layer between the solder ball 70 and the electrolytic plated layer 52. The electrolytic plated layer 53 is formed of a barrier metal layer of a 1–2 $\mu$m-thickness electrolytic plated Ni layer and a 0.1 $\mu$m-thickness elecrolytic plated Au layer formed the latter on the former.

The insulation film may be formed of any film as long as the film is superior in insulation, processing characteristics, mechanical strength, resistance, etc. The insulation film is formed of, e.g., epoxy resin formed by laminating or silica filler-content epoxy resin formed by transfer molding which is formed in an about 100 $\mu$m-thickness (the wire bump has a corresponding height) for the purpose of mitigating thermal stress.

The solder resist film 60 is formed preferably of a photosensitive film having good processing, but is not essentially limited.

Next, the semiconductor device according to a second embodiment of the present invention will be explained with reference to FIG. 2.

In the semiconductor device shown in FIG. 2, an insulation film 40 is formed on the surface of semiconductor chips 10, where the electrodes 15 of semiconductor chips 10 are formed, and a wiring layer 50 is formed on the insulation layer 40. The wiring layer 50 formed on the insulation layer 40 is connected to the electrodes 15 of the semiconductor chips 10. In FIG. 2, the wiring layer 50 formed on the insulation layer 40, and the electrodes 15 of the semiconductor chips 10 are electrically connected to each other by connection members 30 which are formed of wire bumps 31 formed on the electrodes 15 of the semiconductor chips 10, and cured conductive pastes 35 formed on the wire bumps 31, projected therefrom.

In the rest of the second embodiment other than the above, the second embodiment is substantially the same as the first embodiment, and the same parts of the second embodiment as those of the first embodiment are represented in FIG. 2 by the same reference numbers as in FIG. 1 not to repeat their detailed explanation.

The conductive paste 35 can be silver paste, copper paste or others.

As shown in FIG. 2, the connection members 30 can be high and can have the tops pointed.

Then, the semiconductor device according to a third embodiment of the present invention will be explained with reference to FIG. 3.

In the semiconductor device 1 shown in FIG. 3, an insulation layer 45 which is additional to the members forming the semiconductor device according to the second embodiment is formed on a surface of semiconductor chips 10, which is opposite to the surfaces of the semiconductor chips 10 where the electrodes 15 of the semiconductor chips 10 are formed.

In the rest of the third embodiment other than the above, the third embodiment is substantially the same as the second embodiment, and the same parts of the third embodiment as those of the second embodiment are represented in FIG. 3 by the same reference numbers as in FIG. 2 not to repeat their detailed explanation.

The insulation layer 45 may be formed of the same film as the insulation layer 40.

As shown in FIG. 3, the insulation layer 40 and the insulation layer 45 are formed respectively on both sides of the semiconductor chips 10, whereby the occurrence of warps of the semiconductor device 1 can be prevented, and consequently, in mounting semiconductor chips on substrates, higher yields can be achieved.

Next, the semiconductor device according to a fourth embodiment of the present invention will be explained with reference to FIG. 4.

In the semiconductor device shown in FIG. 4, a wiring layer 50 is formed on an insulation layer 40 formed on a surface of semiconductor chips 10, where the electrodes 15 of the semiconductor chips 10 are formed. The wiring layer 50 formed on the insulation layer 40, and the electrodes 15 of the semiconductor chip 10 are connected to each other.

In FIG. 4, the wiring layer 50 on the insulation film 40, and the electrodes 15 of the semiconductor chips 10 are electrically connected by connection members 30 formed of a metal layer 33 formed on the electrodes 15 of the semiconductor chips 10 and cured conductive pastes 35 formed on the metal layer 33.

In the rest of the fourth embodiment other than the above, the fourth embodiment is substantially the same as the first embodiment shown in FIG. 1, and the same parts of the fourth embodiment as those of the first embodiment are represented in FIG. 4 by the same reference numbers as those in FIG. 1 not to repeat their detailed explanation.

Then, the method for fabricating the semiconductor device according to the first embodiment shown in FIG. 1 will be explained with reference to FIGS. 5 and 6.

First, a wafer W which has a plurality of semiconductor chips 10 and the passivation layer 20 having electrodes regions opened and has been subjected to wafer processing are prepared (FIG. 5(a)). The following processing is made on the respective semiconductor chips 10 on the wafer W.

The wire bumps 31 are formed on the electrodes 15 of the respective semiconductor chips 10 by wire bonding (FIG. 5(b)).

Then, the insulation film 40 is formed in a thickness which can cover the wire bumps 31 on the surface of the semiconductor chips 10, where the electrodes 15 are formed (FIG. 5(c)).

The insulation film 40 is heat-cured and then polished thinly into a required thickness to expose the wire bumps 31 (FIG. 5(d)).

In the polishing, ordinarily, the wire bumps 31 also are partially polished, and flat surfaces of the wire bumps 31 are exposed.

Next, as required, the surface of the insulation layer 40 is roughened. Then, the surface of the insulation layer 40 is immersed in a Pd ion-content solution to be activated, and the electroless plated layer 51 is formed by electroless plating (FIG. 5(e)).

The electroless plating can be electroless copper plating or electroless nickel plating.

Thus, the electroless plated layer 51 and the wire bumps 31 are electrically connected to each other.

Then, a resist pattern 51a is formed on the electroless plated layer 51 by photolithography. With the resist pattern 51a as an etching mask and the electroless plated layer as an electric power feed layer, electrolytic plating is selectively performed to form the electrolytic plated layers 52, 53 on the electroless plated layer 51.

Thus, the wiring layer 50 is formed.

The electrolytic plated layer 52 is a main member of the wiring layer 50, and is ordinarily formed mainly of copper. The electrolytic plated layer 53 is a barrier metal layer of an Ni plated layer and an Au plated layer laid in the stated sequence, and can be formed by the known plating.

Then, the resist 51a on the electroless plated layer 51 as the plating mask is removed (FIG. 6(a)), and then the exposed electroless plated layer 51 is removed by soft etching without damages to the wiring layer 50 (FIG. 6(b)).

Then, a photosensitive solder resist 60 is formed by screen printing, covering the wiring layer 50, and required regions alone of the photosensitive solder resist are exposed and developed to open the external terminal regions of the wiring layer 50 (FIG. 6(c)).

Thus, the solder resist 60 having the openings 60a is formed.

Next, the external terminals in the form of the solder balls 70 are formed in the openings 60a of the solder resist layer 60 by reflow (FIG. 6(d)).

The solder balls 70 can be formed by applying the solder to the required regions by screen printing and reflowing the solder, by bonding the balls or other means.

The solder balls 70 have ordinarily about 0.2–0.5 mm$\phi$.

Then, the wafer W is cut into the respective semiconductor chips, and a plurality of the semiconductor devices 1 independent of each other and having the external terminals can be prepared.

The method for fabricating the semiconductor device 1 shown in FIG. 2, as does the above-described fabrication method, comprises forming the wire bumps 31 on the electrodes 15 of the semiconductor chips 10, and applying a conductive paste onto the wire bumps 31 and heat-curing the conductive paste to form the cured conductive pastes 35 in the projected form. The wire bumps 31 and the cured conductive pastes 35 form the connection members 30.

As a method for forming the cured conductive pastes 35, for example, the wafer W with the wire bumps 31 is applied to a surface with silver paste squeegeed in a uniform thickness (about 50 µM) on a plate, and then the wafer W is pulled up to form the silver paste projections having the tops pointed on the wire bumps 31. The silver paste projections are then heated to be cured. The method for forming the cured conductive pastes 35 is not limited to the above-described method.

Next, as in the method shown in FIGS. 5 and 6, the insulation layer 40 is formed, covering the connection members 30, and then polished into a required thickness to expose the connection members 30.

In this polishing, flat surfaces of the cured conductive pastes 35 are exposed.

The same steps as those of the method shown in FIGS. 5 and 6 are followed, and the semiconductor device shown in FIG. 2 is fabricated.

The semiconductor device 1 shown in FIG. 3 can be fabricated by forming the additional insulation layer 45 on the fabricated semiconductor device shown in FIG. 2 on the surface of the semiconducor chips 10, which is opposite to the surface where the electrodes 15 of the semiconductor chips 10.

The insulation layer 45 can be formed as is formed the insulation layer 40.

In the method for fabricating the semiconductor device 1 shown in FIG. 4, without forming the wire bumps 31 on the electrodes 15 of the semiconductor chips 10, the metal layer 33 is formed, as a base metal layer, of two layers of an electroless Ni plated layer and an electroless Au plated layer formed on the electrodes 15 of the semiconductor chips 10 in the stated sequence or two layers of Ti and Pd formed by sputtering, then applying a conductive paste to the metal layer 33 by metal mask printing, and heat-curing the conductive paste into the pointed form. The metal layer 33 and the cured conductive pastes 35 form the connection portions 30.

The steps following this step are the same as those of the method for fabricating the semiconductor device shown in FIG. 2.

EXAMPLES

Examples of the present invention will be explained below.

Example 1

Example 1 is the semiconductor device shown in FIG. 1 which was fabricated by the steps shown in FIGS. 5 and 6.

Example 1 will be explained with reference to FIGS. 5 and 6.

30 µmφ-Au wires were bonded at 230° C. to the electrodes 15 of the respective semiconductor chips of a wafer W (FIG. 5(a)) which has been subjected to wafer processing, and then the wire bumps 31 of a 100 µm-height were formed (FIG. 5(b)).

A 100 µm-thickness epoxy-based insulation material (ABF-SH by Ajinomoto Kabushiki Kaisha) was vacuum laminated and then cured by 1 hour-heat treatment at 170° C., and the insulation layer 40 was formed (FIG. 5(c)).

In the present Example, the wire bumps 31 stucked into the insulation layer 40 by lamination, and the insulation layer 40 covered the wire bumps 31.

Next, the surface of the insulation layer 40 was polished by a polisher to form a 90 µm-thickness, and the tops of the wire bumps 31 were exposed flat (FIG. 5(d)).

Next, the surface of the insulation layer 40 was immersed in a potassium permanganate solution to roughen the surface, and then the surface was rinsed with water. By the elecroless nickel plating under the following conditions, the electroless plated layer 51 of a 0.5 µm-thickness was formed, covering the surface of the insulation layer 40 (FIG. 5(e)).

| <The electroless nickel plating> | | |
|---|---|---|
| Sensitizing: | S-10X (by Uemura Kogyo) | 3 minutes |
| Activating: | A-10X (by Uemura Kogyo) | 3 minutes |
| Electroless plating: | NPR-4 (by Uemura Kogyo) | 1 minute |

Then, a resist was formed on the electroless plated layer 51, by applying PMER-AR900 by Tokyo Ohka Kogyo in a 12 µm-thickness (after prebaking) by a bar coater, and exposed and developed to form the resist 51a having openings which correspond with a configuration of the wiring. On the electroless plated layer 51 exposed in the openings, electrolytic nickel plating, electrolytic copper plating, electrolytic mat-nickel plating and electrolytic gold plating were formed, in the stated sequence, to have respectively in a 1 µm-thickness, an 8 µm-thickness, a 1 µm-thickness and a 0.1 µm-thickness. Thus, the electrolytic plated layer 52, which was to be the main layer of the wiring layer 50, and the electrolytic plated layer 53, which was to the barrier metal layer, were formed by the electrolytic plating.

In Example 1, the 8 µm-thickness copper plated layer corresponds to the electrolytic plate layer 52, which is to be the main layer of the wiring layer 50, and the nickel plated layer and the gold plated layer on the copper layer correspond to the electrolytic plated layer 53, which is to be the barrier metal layer.

The nickel plated layer below the copper plated layer is a layer for preventing the wire bumps 31 of Au and the copper plated layer from alloying each other.

| <The electrolytic nickel plating> | |
|---|---|
| Nickel sulfate (hexahydrate) | 300 g/l |
| Nickel chloride (hexahydrate) | 45 g/l |
| Boric acid | 40 g/l |

-continued

PC nickel

| | |
|---|---|
| A-1 | 10 ml/l |
| A-2 | 1 ml/l |
| Temperature | 50° C. |
| Current density | 1 A/dm$^2$ |
| Time | 1 minute |

<The Electrolytic copper plating>

| | |
|---|---|
| Cooper sulfate (pentahydrate) | 70 g/l |
| Sulfuric acid | 200 g/l |
| Hydrochloric acid | 0.5 ml/l |
| SUPERSLOW 2000 Brightening agent | 10 ml/l |
| SUPERSLOW 2000 Compensating agent | 5 ml/l |
| Temperature | 20° C. |
| Current density | 4 A/dm$^2$ |
| Time | 12 minutes |

<The Electrolytic mat-nickel plating>
WHN Plating Solution (by Nippon Kohjundokagaku)

| | |
|---|---|
| Temperature | 50° C. |
| Current density | 1 A/dm$^2$ |
| Time | 1 minute |

<The Electolytic gold plating>
TEMPERESIST K-91S (by Nippon Kohjundokagaku)

| | |
|---|---|
| Temperature | 60° C. |
| Current density | 0.4 A/dm$^2$ |
| Time | 1 minute |

Then, the resist 51a was removed with acetone (FIG. 6(a)) and then the electroless plated layer 51 was peeled off without possible damages to the wiring layer 50 by soft etching with NYMDENRIP C-11 (FIG. 6(b)).

Furthermore, wet blasting was performed by a wet blasting apparatus by (MAKO KABUSHIKI KASISHA) to remove the catalyst under conditions of alumina abrasive #1000 (mean diameter: 11.5 µm), 20% grain percentage, 0.5 kg/cm$^2$ pump pressure and 10 m/min treatment speed.

Then, rinse was performed, and a photosensitive solder resist (BL-9700 by HITACHI KASEI) was formed by screen printing on the entire surface of the insulation layer 40, covering the wiring layer 50, and the solder resist had a 15 µm-thickness after being dried. The solder resist 60 was developed by using a required pattern mask to form the solder resist layer 60 having the openings 60a in the external terminal forming regions of the wiring layer 50 (FIG. 6(c)).

Then, the solder balls 70 were mounted in the openings 60a of the solder resist layer 60, which were the external terminal forming regions of the wiring layer 50, and reflowed to form the solder balls 70 (FIG. 6d).

Next, the wafer W were cut into respective semiconductor chips 10, and the individual semiconductor devices 1 with the external terminals arranged.

Thus, the semiconductor device shown in FIG. 1 was fabricated.

Example 2

In Example 2, the semiconductor device shown in FIG. 2 was fabricated. As in Example 1, the wire bumps 31 were formed in a 100 µm-height on the electrodes 15 of the semiconductor chips 10. The wafer W with the wire bumps 31 was applied to a surface with silver paste squeegeed in a uniform thickness (about 50 µm thickness) on a plate. Then, the wafer W was pulled up to form on the wire bumps 31 the silver paste projections having the tops pointed. The silver paste projections were heated to be cured, and the cured conductive pastes 35 of the cured silver paste were formed. A total height of the wire bums 31 and the cured conductive pastes 35 was about 150 µm after being dried. (FIG. 7)

Then, the insulation film was formed in a 180 µm-thickness of silica filler content-epoxy resin by transfer molding, covering the wire bumps 31 and the cured conductive pastes 35.

The same processing as in Example 1 was followed, and the semiconductor device 1 shown in FIG. 1 was fabricated.

The insulation layer 40 after polished had a 130 µm-thickness.

Example 3

In Example 3, the semiconductor device shown in FIG. 3 was fabricated. In Example 3, by the method for fabricating the semiconductor device shown in FIG. 2, the cured conductive pastes 35 were formed on the wire bumps 31, a total height of the wire bumps 31 and the cured conductive pastes 35 was 150 µm after being dried, and the insulation layer 40 was formed, by transfer molding, of silica filler content-epoxy resin on the surface of the wafer W, where the electrodes 15 were formed, and the insulation layer 45 was formed in a 130 µm-thickness on the opposite surface.

Then, the same processing as in Example 1 was followed, and the semiconductor device shown in FIG. 3 was fabricated.

Example 4

In Example 4, the semiconductor device 1 shown in FIG. 4 was fabricated.

First, the wafer W with the openings formed in the passivation layer at the electrodes 15 was subjected to zincate conversion to form a zincate thin film on the surface of the Al electrodes 15. Then, electroless Ni plated layer and an electroless Au plated layer were formed on the zincate thin film in the stated sequence respectively in 3 µm-thickness and 0.1 µm-thickness.

Next, the conductive paste projections were formed of GP913 produced by Asahi Kasei Kogyo Kabushiki Kaisha as a conductive paste material by printing using a metal mask, and the conductive paste projections were heated at 180° C. for 1 hour. The conductive paste projections were formed in a 150 µm-height. (FIG. 8)

Then, the same process as in Example 2 was followed, and the semiconductor device 1 shown in FIG. 4 was fabricated.

The insulation layer 40 after polished had a 130 µm-thickness.

The electroless Ni plating was performed by using the same chemical liquid as in Example 1. The electroless Au plating was performed as follows:

<The electroless Au plating>
LECTROLESS Au (by EEJA) 80° C., 5 minutes

According to the present invention, semiconductor devices which do not easily undergo, mounted on a substrate, cracks in the semiconductor chips, and warps even when temperatures change, and which can give a high yields.

What is claimed is:

1. A method for fabricating a semiconductor device comprising the steps of:

preparing a wafer including a plurality of semiconductor chips with electrodes formed thereon;

forming connection members on the electrodes of the respective semiconductor chips by Au wire bonding, the connection members extending in a direction perpendicular to the semiconductor chips and having a longitudinal shape and an area of contact with a herein later identified wiring layer that is less than an area of contact with an electrode, wherein the connection members are Au wire bumps, each having a hemisphere portion and a longitudinal portion;

forming an insulation layer in a thickness to cover the connection members that have been formed on the surfaces of the respective semiconductor chips where the electrodes of the semiconductor chips are formed;

polishing the insulation layer to expose the connection members;

forming an electroless plated layer on the insulation layer; and forming, with the electroless plated layer as a feeder layer of electric current, an electrolytic plated layer on the electroless plated layer selectively only in regions for a wiring layer;

etching off the electroless plated layer except regions of the electroless plated layer corresponding to the electrolytic plated layer to form the wiring layer including the electroless plated layer and the electrolytic plated layer; and severing the wafer into the respective semiconductor chips to fabricate the semiconductor device.

2. The method for fabricating a semiconductor device according to claim 1, further comprising the steps of:

forming a solder resist layer having openings on the wiring layer; and forming solder balls in the openings of the solder resist layer, connected to the wiring layer.

3. The method for fabricating a semiconductor device according to claim 1, wherein the connection members are formed by forming wire bumps on the electrodes of the semiconductor chips by wire bonding.

4. The method for fabricating a semiconductor device according to claim 3, wherein the connection members are formed by forming cured conductive pastes on the wire bumps.

5. The method for fabricating a semiconductor device according to claim 1; wherein the connection members are formed on the electrodes of the semiconductor chips by forming a metal layer by sputtering and forming cured conductive pastes on the metal layer.

6. The method for fabricating a semiconductor device according to claim 1, wherein in the step of forming an electrolytic plated layer, a resist pattern of a prescribed configuration is formed on the electroless plated layer, and the electrolytic plated layer is selectively formed with the resist pattern as a plating-resistant mask.

7. The method for fabricating a semiconductor device according to claim 6, wherein in the step of forming an wiring layer by etching, the resist pattern of a prescribed configuration on the electroless plated layer is removed, and then the exposed electroless plated layer is removed by soft etching without damaging the wiring layer.

8. The method for fabricating a semiconductor device according to claim 1, wherein the step of polishing the insulation layer is followed by surface roughening processing for roughening the surface of the insulation layer.

9. The method for fabricating a semiconductor device according to claim 2, wherein in the step of forming a solder resist layer, a photosensitive solder resist is formed by screen printing, to cover the wiring layer, and prescribed regions of the photosensitive solder resist are exposed and developed to form the openings so as to expose the wiring layer.

* * * * *